US006507530B1

United States Patent
Williams et al.

(10) Patent No.: US 6,507,530 B1
(45) Date of Patent: Jan. 14, 2003

(54) WEIGHTED THROTTLING MECHANISM WITH RANK BASED THROTTLING FOR A MEMORY SYSTEM

(75) Inventors: Michael W. Williams, Citrus Heights, CA (US); James M. Dodd, Shingle Springs, CA (US); Lloyd L Pollard, II, Portland, OR (US); Nitin B Gupte, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/967,642

(22) Filed: Sep. 28, 2001

(51) Int. Cl.[7] .................................................. G11C 7/00
(52) U.S. Cl. ................................... 365/226; 365/189.07
(58) Field of Search ........................... 365/221, 230.06, 365/226, 189.07, 236, 233

(56) References Cited

U.S. PATENT DOCUMENTS

| 5,602,790 A | 2/1997 | Mullarkey |
| 5,801,982 A | 9/1998 | Blodgett |
| 5,875,142 A | 2/1999 | Chevallier |
| 5,898,343 A | 4/1999 | Morgan |
| 5,903,506 A | 5/1999 | Blodgett |
| 5,963,103 A | 10/1999 | Blodgett |
| 6,021,076 A | 2/2000 | Woo |
| 6,262,749 B1 * | 7/2001 | Finger et al. ................ 128/916 |
| 6,300,961 B1 * | 10/2001 | Finger et al. ................ 345/505 |
| 6,317,364 B1 * | 11/2001 | Guterman et al. ...... 365/185.01 |

* cited by examiner

Primary Examiner—David Nelms
Assistant Examiner—Thong Le
(74) Attorney, Agent, or Firm—Pillsbury Winthrop LLP

(57) ABSTRACT

A memory system includes a plurality of memory device ranks. A memory controller having a connection with the plurality of memory device ranks is adapted to obtain command information being issued to one of the plurality of memory device ranks. The memory controller is also adapted to generate a power weight value based on a command type from the command information. The memory controller increments a power count of the one of the plurality of memory device ranks by the power weight value generated. The memory controller then compares the power count of the one of the plurality of memory device ranks to a threshold value set for the one of the plurality of memory device ranks. If it is determined that the power count exceeds the threshold value, the memory controller is adapted to throttle the one of the plurality of memory device ranks.

29 Claims, 2 Drawing Sheets

WEIGHTED THROTTLING MECHANISM WITH RANK BASED THROTTLING FOR A MEMORY SYSTEM

BACKGROUND OF THE INVENTION

1. Field of the Invention

The present invention generally relates to control of a memory system. More particularly, the present invention relates to the throttling of a dynamic random access memory (DRAM) based subsystem of computing platforms.

2. Discussion of the Related Art

As the peak bandwidth capabilities of a memory subsystem (such as a DRAM memory device) increase, there is a greater potential to damage the components of the memory subsystem through thermal overstress. If the heat generated by the memory device is not removed properly, the internal temperature of the memory device will rise beyond the maximum tolerated by the device and the device will eventually fail. The increased potential for thermal overstress is a direct consequence of the increased rate not only of data transfer, but that of command and address transfers as well. This situation necessitates a method of preventing such damage to the various entities forming a memory subsystem, which may include a memory controller and DRAM components. The thermal time constants of the components forming the memory subsystem are on the order of seconds, and therefore, the "activity" level or rate of the memory subsystem must be maintained over some period of time (e.g., greater than 100 milliseconds) in order to possibly foster a thermal overstress event.

One way to prevent damage via thermal overstress is to detect when the activity rate in a memory subsystem has been at a potentially damaging level for a period of time. Then, the rate of access to the memory subsystem may be throttled back (i.e., scaled back) to a level that prevents the thermal overstress.

This throttling scheme has been implemented in previous memory systems. However, it is simplistic in its implementation. In other words, throttling in the prior art is based only on the aggregate data transfer rates sustained over a period of time. This throttling methodology has some serious flaws. For example, it considers the memory subsystem as an indivisible entity, which may be an erroneous assumption. In many systems, multiple partitions of memory exist, and not all partitions are active simultaneously. Secondly, prior throttling methodology does not account for all of the commands sent to the memory subsystem. Finally, the prior art throttling methodology fails to acknowledge the fact that different commands have different power consumption rates, and thus lead to different thermal results. These deficiencies often lead to the necessity to overcompensate by over-throttling the memory subsystem in order to maintain a reasonable margin of safety.

Accordingly, there is a need for a system and method of throttling to enable more precise control over the memory subsystem, and to alleviate the necessity to over-throttle in order to provide optimum performance versus thermal overstress protection.

DETAILED DESCRIPTION

Figure 1:
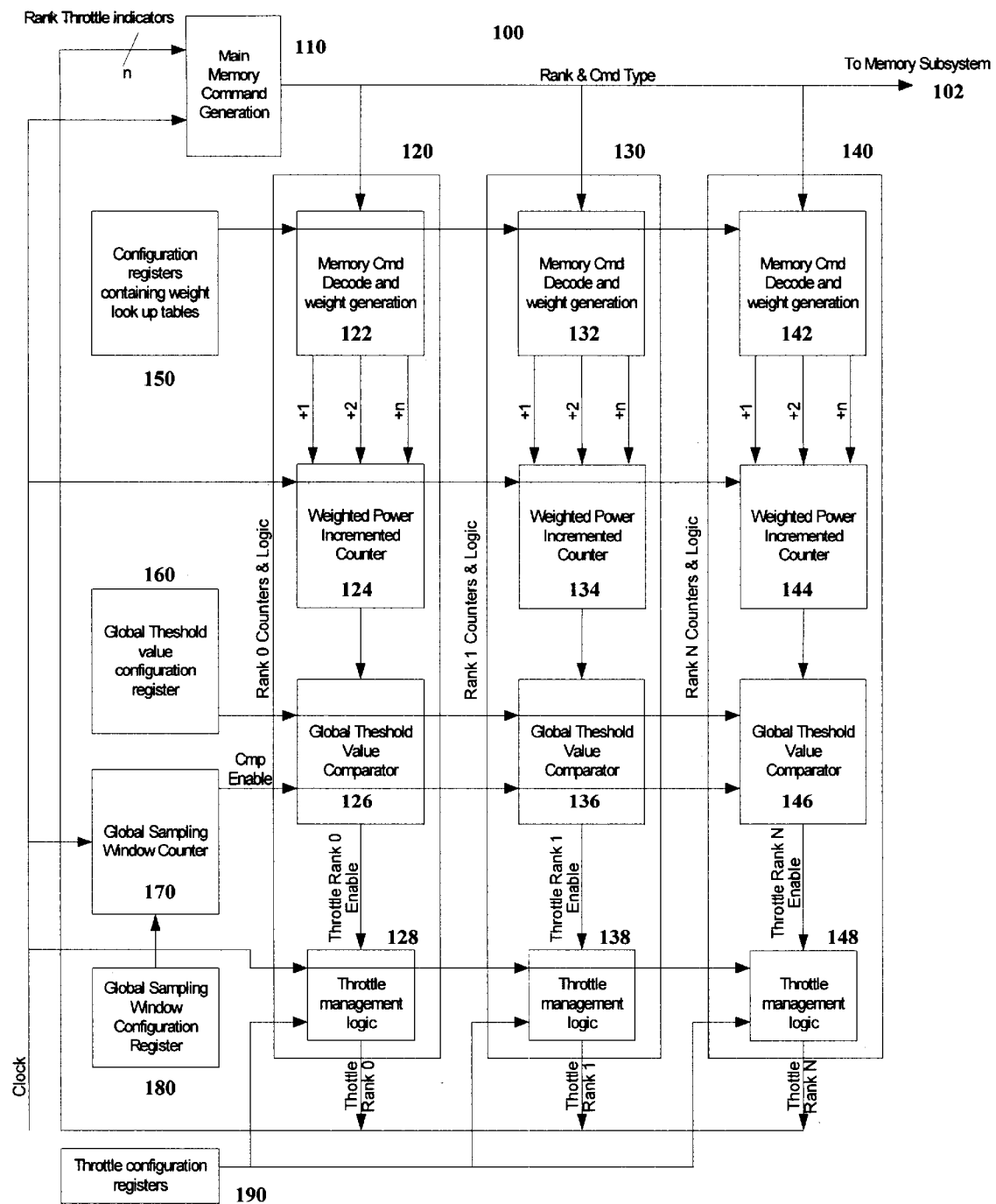
FIG. 1 illustrates throttling logic sets according to an embodiment of the present invention.

FIG. 1 illustrates throttling logic sets according to an embodiment of the present invention. At least one throttling logic set 120, 130, 140 may be provided within a memory controller, or on a separate component, in communication with a one or more memory device ranks (e.g., DRAM device ranks) (not shown). A rank may be defined as all of the components connected to the same chip select. An alternative definition of a rank may be the component or components that supply all of the data for an access (command). A main memory command generation circuit 110 generates command information to be issued to a particular memory device rank in the memory subsystem 102.

At the front end of the throttling logic sets 120, 130, 140, the command information being issued to the memory subsystem 102 is also received by a memory command decode and weight generation circuit 122, 132, 142. The command information may include the command being issued (e.g., an activate command, a read command, a write command, a precharge command, a refresh command, a standby command, an idle command, or any other command type), as well as information indicating to which rank the command is directed. In an embodiment where multiple memory device ranks form the memory subsystem 102, there is preferably a throttling logic set for each memory device rank in the memory subsystem 102. However, in an alternative embodiment of the present invention, a single throttling logic set may be utilized to accommodate a plurality of memory device ranks.

In the embodiment where a throttling logic set 120, 130, 140 is provided for each memory device rank in a memory subsystem 102, the memory command decode and weight generation circuit 122, 132, 142 not only determines the command being issued, but also determines to which memory device rank in the memory subsystem 102 the command is directed so that the appropriate throttling logic set 120, 130, 140 may process the command. If the memory device rank is determined to match a particular throttling logic set 120, 130, 140 assigned to that memory device rank, then the memory command decode and weight generation circuit 122, 132, 142 for that particular throttling logic set 120, 130, 140 generates a power weight value for the command. The power weight value is generated based on the particular command type (e.g., an activate command, a read command, a write command, a precharge command, a refresh command, a standby command, an idle command, etc.) issued to the memory device rank.

According to one embodiment of the present invention, the power weight value for each command type may be hard-coded into, for example, a memory controller, or any other logic circuit. A look-up table, like the following example, may be utilized to provide the power weight value for each command type:

| Command Type | Power Weight Value |
| --- | --- |
| Activate (ACT) | 5 |
| Read (RD) | 3 |
| Write (WR) | 2 |
| Precharge (PRE) | 2 |
| Refresh (REF) | 6 |
| Standby (STDBY) | 1 |
| Idle (IDLE) | 0 |

The above table is merely illustrative and is not meant to provide an exhaustive or exclusive command-to-power-weight-value mapping, nor is it an exhaustive or exclusive list of all the command types that may be implemented. For example, the IDLE command/state above is illustrated as having a value of zero. But, in certain situations, it may be beneficial to assign a non-zero value to the IDLE command/state to provide greater flexibility to the entire system. For example, there may be lower power states than IDLE that exist in a memory device rank that cannot be tracked via the command stream, but should be accounted for by the system. Preferably, the power weight value represents a relative amount of thermal heating generated by the memory device rank in order to execute a corresponding command type. Therefore, commands that generate less thermal heating have lower power weight values than those commands that generate greater thermal heating.

According to another embodiment of the present invention, the power weight values may be provided via programmable configuration registers 150 in a memory controller. These configuration registers 150 may be programmed during initialization of the memory subsystem 102. The information utilized to program the configuration registers 150 may be obtained from, for example, reading a serial presence detect (SPD) device on a dual-inline memory module (DIMM) containing DRAM components. The SPD device is illustratively an electrically-erasable programmable read-only memory (EEPROM) device on a synchronous dynamic random access memory (SDRAM) module. The information stored on the SPD device provides the basic input/output system (BIOS) with the module's size, speed, data width, and voltage. The BIOS utilizes this information to configure the memory module properly for maximum reliability and performance. The SPD devices are typically read by the BIOS during boot-up of the system. Information included in the SPD device may be similar to the look-up table above, and may also be vendor and version specific.

The power weight values may be modified if an indication of temperature is available. In a memory system having thermal sensors, the power weight values may be modified based on the temperature detected by the sensors. For example, the temperature value of the thermal sensor may be read periodically (such as on the same order of time as the thermal time constant for the memory device), and all of the power weight values may be increased if the temperature is trending upwards, or decreased if the temperature is trending downwards. The power weight values may also be modified based on the "quality" of the thermal sensor data obtained. That is, the closer the thermal sensor is located to the memory devices (e.g., DRAMs), the more accurate the temperature information. Therefore, with more accurate temperature information, there may be a lesser necessity to try to overcompensate for potential errors in the temperature measurement.

Once a power weight value has been determined, it is transmitted to a power weight value counter circuit 124, 134, 144. The power weight value counter circuit 124, 134, 144 is adapted to increment a power count kept for the particular memory device rank to which it is assigned. According to the embodiment as illustrated in FIG. 1, a clock input to the power weight value counter circuit 124, 134, 144 allows the power count to be incremented in synchronization with the rest of the memory controller system.

In an alternative embodiment of the present invention, a global sampling window counter circuit 170 may be provided to keep track of a recurring segment of time during which activity to the memory subsystem is monitored. At the end of each sampling window time period, a "compare enable" signal may be issued to a threshold value comparator circuit 126, 136, 146 to compare the power count with a threshold value (discussed further below). The global sampling window counter circuit 170 also may be utilized to provide a "decrement enable" signal to the power weight value counter circuit 124, 134, 144. If the power weight value counter 124, 134, 144 storing the power count has not incremented in some time, the memory device rank that it is tracking has not been active, and its power count value may be decreased, as the temperature of a device decreases if no activity occurs in the device. The "decrement enable" signal may be a bit within the global sampling window counter 170 so that whenever this bit toggles, the opportunity to decrement the power count maintained by the power weight value counter circuit 124, 134, 144 is evaluated.

A global sampling window configuration register 180 may be provided to store and provide timing data (such as timing values for sampling window time periods), which may be programmable, to the global sampling window counter 170.

The power count is transmitted to the threshold value comparator circuit 126, 136, 146. The power count is compared against a predetermined threshold value. The threshold value is selected based on a memory device's temperature tolerance characteristics. The power count is akin to a thermometer that keeps track of the temperature of a particular memory device. Preferably, the power weight values for each command type of a particular memory device is evaluated and weighted accordingly relative to each command type for that memory device. A determination is made so as to correlate the relationship between a value of the power count and the increase in temperature of a memory device. Once that determination has been made, a threshold value, corresponding to a temperature value not to be exceeded in order to maintain safe operation of the memory device, may be established.

If the power count is determined to exceed the threshold value at any time during a global sampling window time period, the memory device rank is forced into a throttling regime. The selection of a sampling window time period may be based on a temperature gradient resulting from a change of bandwidth from a steady state to that of the maximum bandwidth. Although any suitable time period may be established, the global sampling window time period is preferably a fraction of and up to one second long.

The throttling value may be hardwired, or it may be programmed into a threshold value configuration register 160. The threshold value configuration register 160 may contain a global value for all of the memory device ranks in the memory subsystem 102, or may contain values specific to each memory device rank (e.g., due to utilizing different brands, models, versions, etc. of memory device ranks in a memory subsystem 102). Therefore, these threshold values may be vendor and/or version specific.

When the throttling regime is entered, a throttle rank enable signal is forwarded to a throttle management logic circuit 128, 138, 148. The throttle management logic circuit 128, 138, 148 is configured to transmit indicators or signals to the main memory command generation circuit 110, preferably residing in the memory controller, indicating that accesses (commands) to the particular memory device rank need to be throttled. Throttle configuration registers 190 may be provided to store and provide throttle regime values and parameters to the throttling management logic circuit 128, 138, 148. For example, the throttle configuration registers

190 may store values and parameters of the amount of throttling, the throttling monitoring window time period, how long to implement the throttling regime, etc. Any values and parameters relating to the throttling management logic may be stored and/or programmed within the throttle configuration registers 190.

Figure 2:
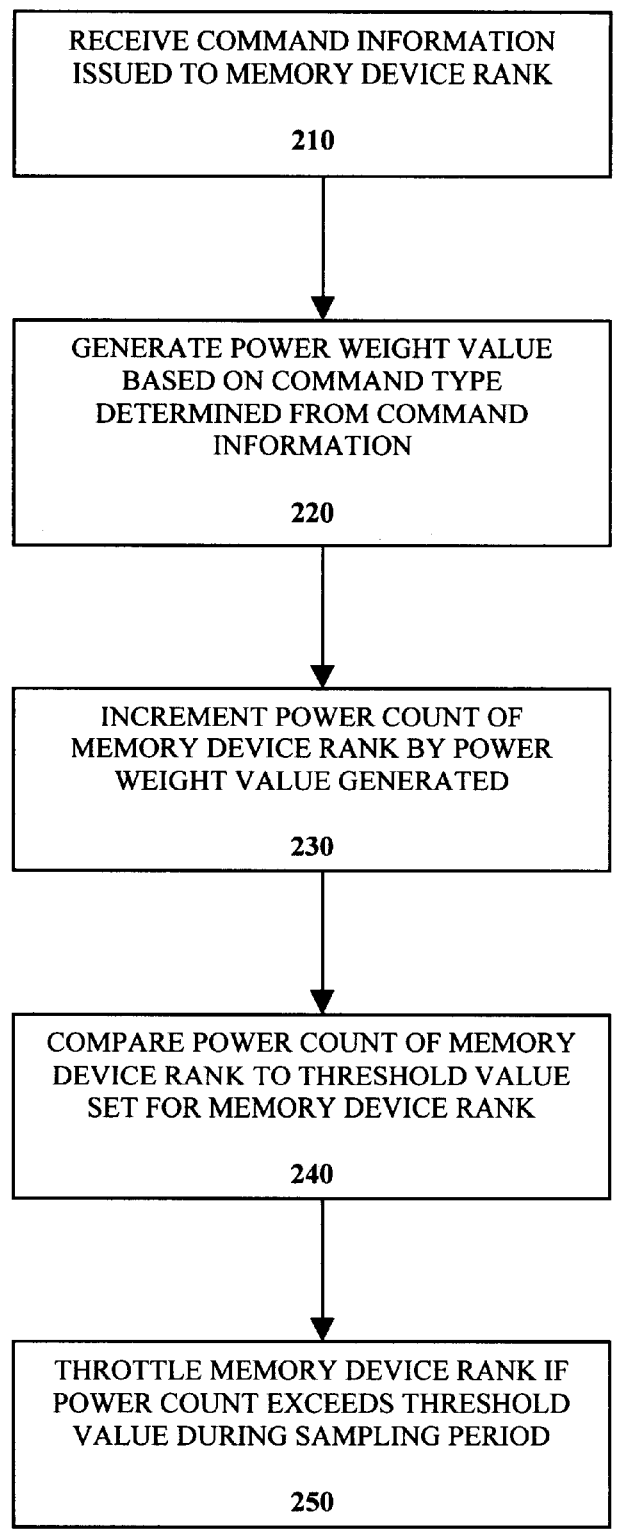
FIG. 2 illustrates a flow chart diagram of a throttling operation according to an embodiment of the present invention.

FIG. 2 illustrates a flow chart diagram of a throttling operation according to an embodiment of the present invention. The memory command decode and weight generation circuit 122, 132, 142 of the throttling logic set 120, 130, 140 receives 210 command information being issued to a memory device rank in the memory subsystem 102. The memory command decode and weight generation circuit 122, 132, 142 generates 220 a power weight value based on a command type determined from the command information. A power weight value counter circuit 124, 134, 144 increments 230 a power count of the memory device rank by the power weight value generated. A threshold value comparator circuit 126, 136, 146 compares 240 the power count of the memory device rank to a threshold value set for the memory device rank. If it is determined that the power count exceeds the threshold value at any time during a sampling period, a throttling management logic circuit 128, 138, 148 throttles 250 the memory device rank.

The present invention provides a system and method of throttling to enable more precise control over a memory subsystem, and to alleviate over-throttling, in order to provide optimum performance versus thermal overstress protection. Therefore, more efficient and higher-performance DRAM memory subsystems result. Because the ability to precisely manage the problem of thermal overstress becomes increasingly important as clock frequencies increase, the present invention provides solutions to optimize thermal protection at high performance levels.

Moreover, the present invention may be implemented in other interface systems where commands and data are transmitted and received by various electronic components. Accordingly the present invention is not simply limited to use in memory subsystems to control thermal overstress, but may be implemented in a number of suitable electronic systems.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A method of throttling a memory device rank, comprising:
    obtaining command information being issued to the memory device rank;
    generating a power weight value based on a command type from the command information;
    incrementing a power count of the memory device rank by the power weight value generated;
    comparing the power count of the memory device rank to a threshold value set for the memory device-rank; and
    throttling the memory device rank if the power count exceeds the threshold value.

2. The method according to claim 1, wherein the power weight value corresponds to an amount of thermal heating generated by the memory device rank in order to execute a particular command type so that commands that generate less thermal heating have lower power weight values than those commands that generate greater thermal heating.

3. The method according to claim 1, further including utilizing a look-up table to determine the power weight value corresponding to the command type determined from the command information.

4. The method according to claim 1, further including decrementing the power count when a lack of activity on the memory device rank is determined.

5. The method according to claim 1, further including:
    sensing a temperature of the memory device rank; and
    adjusting the power weight value based on the temperature sensed.

6. A memory system, comprising:
    a plurality of memory device ranks; and
    a memory controller coupled to the plurality of memory device ranks and at least one throttling logic set, the throttling logic set having
        a memory command decode and weight generation circuit to obtain command information being issued to one of the plurality of memory device ranks and to generate a power weight value based on a command type from the command information,
        a power weight value counter circuit to increment a power count of the one of the plurality of memory device ranks by the power weight value generated,
        a threshold value comparator circuit to compare the power count of the one of the plurality of memory device ranks to a threshold value set for the one of the plurality of memory device ranks, and
        a throttling management logic circuit to throttle the one of the plurality of memory device ranks if the power count exceeds the threshold value.

7. The memory system according to claim 6, wherein the power weight value corresponds to an amount of thermal heating generated by the one of the plurality of memory device ranks in order to execute a particular command type so that commands that generate less thermal heating have lower power weight values than those commands that generate greater thermal heating.

8. The memory system according to claim 6, wherein the power weight value counter is adapted to decrement the power count when a lack of activity on the one of the plurality of memory device ranks is determined.

9. The memory system according to claim 6, further including:
    a temperature sensor to sense a temperature of the one of the plurality of memory device ranks; and
    a power weight value modification circuit to adjust the power weight value based on the temperature sensed.

10. The memory system according to claim 6, wherein the memory controller further includes configuration registers having look-up tables that store power weight values corresponding to respective command types to provide to the memory command decode and weight generation circuit.

11. The memory system according to claim 6, wherein the memory controller further includes a threshold value configuration register storing at least one threshold value to provide to the throttling management logic circuit.

12. A memory controller, comprising:
    a machine-readable storage medium; and
    machine-readable program code, stored on the machine readable storage medium, the machine-readable program code having instructions to obtain command information being issued to a memory device rank, generate a power weight value based on a command type from the command information, increment a power count of the memory device rank by the power weight value generated, compare the power count of the memory device rank to a threshold value set for the memory device rank, and throttle the memory device rank if the power count exceeds the threshold value.

13. The memory controller according to claim 12, wherein the power weight value corresponds to an amount of thermal heating generated by the memory device rank in order to execute a particular command type so that commands that generate less thermal heating have lower power weight values than those commands that generate greater thermal heating.

14. The memory controller according to claim 12, wherein the machine-readable program code includes instructions to utilize a look-up table to determine the power weight value corresponding to the command type determined from the command information.

15. The memory controller according to claim 12, wherein the machine-readable program code includes instructions to decrement the power count when a lack of activity on the memory device rank is determined.

16. The memory controller according to claim 12, wherein the machine-readable program code includes instructions to:

receive a temperature of the memory device rank; and adjust the power weight value based on the temperature received.

17. A memory system, comprising:

a plurality of memory device ranks; and a memory controller having a connection with the plurality of memory device ranks, the memory controller being adapted to generate command information to one of the plurality of memory device ranks, to generate a power weight value based on a command type from the command information, to increment a power count of the one of the plurality of memory device ranks by the power weight value generated, to compare the power count of the one of the plurality of memory device ranks to a threshold value set for the one of the plurality of memory device ranks, and to throttle the one of the plurality of memory device ranks if the power count exceeds the threshold value.

18. The memory system according to claim 17, wherein the power weight value corresponds to an amount of thermal heating generated by the one of the plurality of memory device ranks in order to execute a particular command type so that commands that generate less thermal heating have lower power weight values than those commands that generate greater thermal heating.

19. The memory system according to claim 17, wherein the memory controller is further adapted to decrement the power count when a lack of activity on the one of the plurality of memory device ranks is determined.

20. The memory system according to claim 17, further including:

a temperature sensor to sense a temperature of the one of the plurality of memory device ranks; and a power weight value modification circuit to adjust the power weight value based on the temperature sensed.

21. The memory system according to claim 17, wherein the memory controller further includes configuration registers having look-up tables that store power weight values corresponding to respective command types.

22. The memory system according to claim 17, wherein the memory controller further includes a throttling configuration register storing at least one threshold value.

23. A method of throttling an electronic component, comprising:

obtaining command information being issued to the electronic component;

generating a power weight value based on a command type from the command information;

incrementing a power count of the electronic component by the power weight value generated;

comparing the power count of the electronic component to a threshold value set for the electronic component; and throttling the electronic component if the power count exceeds the threshold value.

24. The method according to claim 23, wherein the power weight value corresponds to an amount of thermal heating generated by the electronic component in order to execute a particular command type so that commands that generate less thermal heating have lower power weight values than those commands that generate greater thermal heating.

25. The method according to claim 23, further including utilizing a look-up table to determine the power weight value corresponding to the command type determined from the command information.

26. The method according to claim 23, further including decrementing the power count when a lack of activity on the electronic component is determined.

27. An electronic system, comprising:

a plurality of electronic components; and an interface having a connection with the plurality of electronic components, the interface being adapted to generate command information to one of the plurality of electronic components, to generate a power weight value based on a command type from the command information, to increment a power count of the one of the plurality of electronic components by the power weight value generated, to compare the power count of the one of the plurality of electronic components to a threshold value set for the one of the plurality of electronic components, and to throttle the one of the plurality of electronic components if the power count exceeds the threshold value.

28. The electronic system according to claim 27, wherein the power weight value corresponds to an amount of thermal heating generated by the one of the plurality of electronic components in order to execute a particular command type so that commands that generate less thermal heating have lower power weight values than those commands that generate greater thermal heating.

29. The electronic system according to claim 27, wherein the interface is further adapted to decrement the power count when a lack of activity on the one of the plurality of electronic components is determined.

* * * * *